(12) United States Patent
Brandt

(10) Patent No.: US 6,538,515 B2
(45) Date of Patent: Mar. 25, 2003

(54) POWER AMPLIFIER AND METHOD OF OPERATING A POWER AMPLIFIER HAVING MULTIPLE OUTPUT-POWER MODES

(75) Inventor: Per-Olof Brandt, Staffanstorp (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 40 days.

(21) Appl. No.: 09/764,274

(22) Filed: Jan. 19, 2001

(65) Prior Publication Data

US 2002/0097096 A1 Jul. 25, 2002

(51) Int. Cl.[7] .................................................. H03G 3/10
(52) U.S. Cl. ....................... 330/285; 330/295; 330/296; 330/297; 330/302
(58) Field of Search ................................ 330/285, 295, 330/296, 297, 302

(56) References Cited

U.S. PATENT DOCUMENTS

| | | | |
|---|---|---|---|
| 4,831,334 A | 5/1989 | Hudspeth et al. | 330/10 |
| 5,146,178 A | 9/1992 | Nojima et al. | 330/251 |
| 5,903,854 A | 5/1999 | Abe et al. | 455/575 |

FOREIGN PATENT DOCUMENTS

| | | |
|---|---|---|
| EP | 0883241 A1 | 12/1998 |
| EP | 0887924 A2 | 12/1998 |
| GB | 1 501 082 | 2/1978 |
| WO | WO 98/37627 | 8/1998 |
| WO | WO 99/54994 | 10/1999 |

OTHER PUBLICATIONS

Shea et al. "Principles of Transistor Circuits" John Wiley & Sons Copyright 1953 pp. 25 and 297.*
Burnill, J. "AM Transmitting", Electronics World and Wireless World, GB, Reed Business Publishing, Sutton, Surrey, vol. 101, No. 1706, 1995, pp. 58–60.
EPO International Search Report, RS106602, dated Jul. 13, 2001.
Tyberghien, G.; Form PCT/ISA/210; International Search Report for PCT/EP 02/00387 as completed Jul. 23, 2002; 4 pages.

* cited by examiner

Primary Examiner—Michael B Shingleton
(74) Attorney, Agent, or Firm—Jenkens & Gilchrist, P.C.

(57) ABSTRACT

A power amplifier that operates at a high efficiency over a wide power range. In one embodiment, the power amplifier includes a first circuit having a first transistor including an input terminal for receiving an RF input, a first output terminal connected to ground, and a second output terminal connected to a first inductor connected in series with a capacitor and also connected to a voltage supply through a first controllable connector; a second circuit including a second transistor having an input terminal for receiving the radio frequency (RF) input, a first output terminal connected to ground, and a second output terminal connected to a second inductor connected in series with the capacitor and also connected to a voltage supply through a second controllable connector; and bias means for biasing the first transistor and the second transistor, wherein the first circuit is connected in parallel to the second circuit.

25 Claims, 5 Drawing Sheets

POWER AMPLIFIER AND METHOD OF OPERATING A POWER AMPLIFIER HAVING MULTIPLE OUTPUT-POWER MODES

BACKGROUND OF THE INVENTION

1. Field of the Invention

The present invention is generally related to power amplifiers, and, more specifically, to a power amplifier designed to be used at two or more output powers.

2. Discussion of the Background

In transmitters used in GSM like systems, the output power of the transmitter is controlled by a power amplifier ("PA"). The efficiency at which a PA operates is dependent upon the amount of power being produced and the load seen by the PA. That is, for a given load being driven by the PA, there is an output power at which the efficiency of the PA is maximized. This output power is referred to as the "optimum output power". Thus, for a given load, a PA operates less efficiently when the output power is lowered from the optimum output power, unless the load of the PA is appropriately adjusted.

If the output power range is desired to be very wide (for example, 0–33 dBm), this method becomes complicated. One solution is to use a DC/DC converter. But this solution is costly and takes up a great deal of space.

What is desired, therefore, is a system and/or method that overcomes these and other disadvantages associated with power amplifiers.

SUMMARY OF THE INVENTION

Embodiments of the present invention provide a power amplifier that operates at a high efficiency over a wide power range. According to one embodiment, the power amplifier includes two circuits connected in parallel. The first circuit and the second circuit each include a transistor. Each transistor is connected to a supply voltage through a controllable connector, such as a switch a linear regulator. Each transistor is also connected through an inductor to a shunt capacitor to ground. In full output power mode all transistors are connected to the supply voltage through a controllable connector and all transistors are biased normally. In less than full output power mode, one of the transistors is disconnected from the supply voltage by "turning off" the connector that connects the transistor to the supply voltage. While disconnected from the supply voltage, the transistor's bias voltage is increased, thereby forming a low resistance to ground. This means that the inductor connected to the transistor is now connected to ground and in parallel with the shunt capacitor. What then happens is that the negative admittance of the circuit formed by the shunt capacitor and inductor is lowered and that the Inductance (L) increases since one of the inductors is no longer in parallel with the other inductors. The increase in the Inductance causes the impedance at the collector to increase. The increase in the impedance at the collector results in realization of a high efficiency at the lower output power.

Depending on how many of the transistors are short circuited to ground, a different impedance can be presented for the power amplifier. It is possible to choose a matching network which makes it possible to maintain the correct phase of the load at least for the lower impedance.

Further features and advantages of the present invention, as well as the structure and operation of various embodiments of the present invention, are described in detail below with reference to the accompanying drawings.

It should be emphasized that the term "comprises/comprising" when used in this specification is taken to specify the presence of stated features, integers, steps, or components but does not preclude the presence or addition of one or more other features, integers, steps, components or groups thereof.

BRIEF DESCRIPTION OF THE DRAWINGS

The accompanying drawings, which are incorporated herein and form part of the specification, illustrate various embodiments of the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

Figure 1:
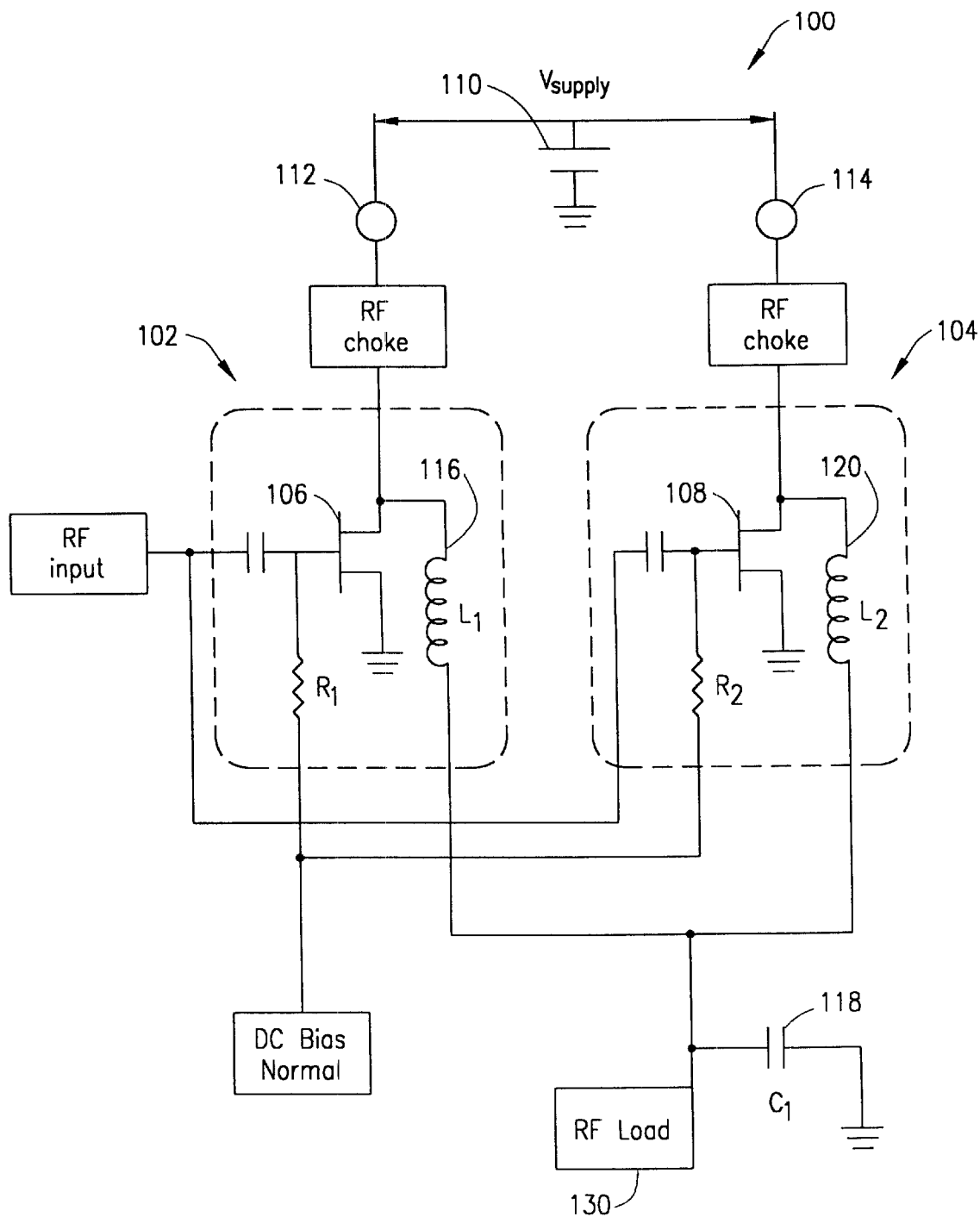
FIG. 1 depicts one possible implementation of a power amplifier according to the present invention.

FIG. 1 depicts one possible implementation of a power amplifier 100 according to the present invention. As illustrated in FIG. 1, power amplifier 100 is divided into two parallel circuits 102 and 104. The first circuit 102 includes a transistor 106 and the second circuit 104 includes a transistor 108. Transistors 106 and 108 may be implemented with either current controlled bipolar junction transistors (BJTs) or voltage controlled Field Effect Transistors (FETs). In short, any transistor with low "on" resistance is suitable. Transistor 106 is selectably connected to a supply voltage 110 through a controllable connector 112, such as a switch or a linear regulator, for example. Transistor 106 is also connected through a transmission line or an inductor or other equivalent circuit (hereafter "inductor") 116 to a capacitor 118, which is connected to ground. Similarly, transistor 108 is connected to the supply voltage 110 through a controllable connector 114, and transistor 108 is also connected through an "inductor" 120 to the shunt capacitor 118.

Figure 3:
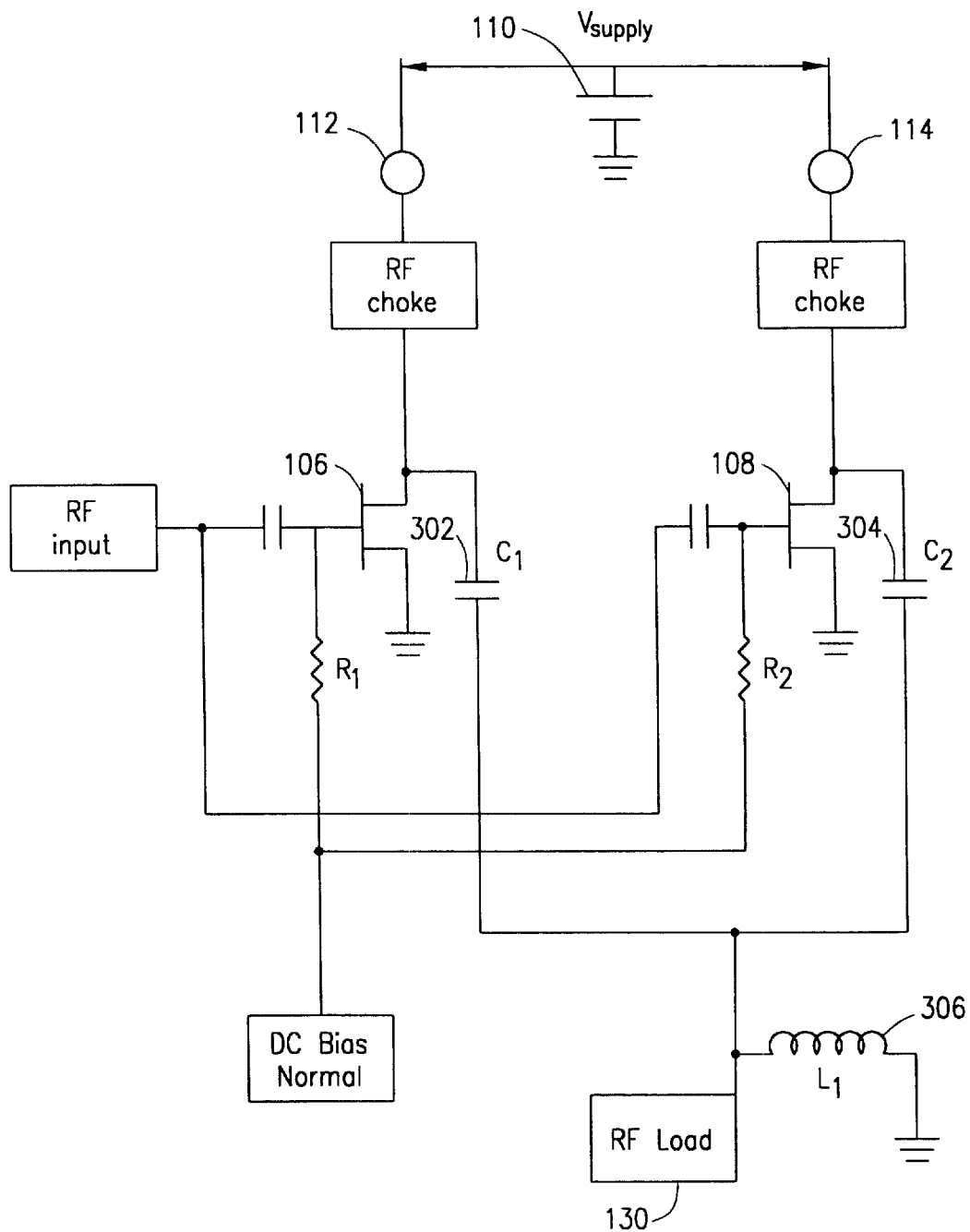
FIG. 3 depicts power amplifier according to a second embodiment of the present invention.

FIG. 3 depicts another possible implementation of a power amplifier according to the present invention. In the embodiment depicted in FIG. 3, inductors 116 and 120 of FIG. 1 are replaced with capacitance 302 and 304, respectively, and capacitor 118 of FIG. 1 is replaced with inductance 306. This particular embodiment would have some benefits in certain applications, such as, in on chip matching, for example.

Figure 4:
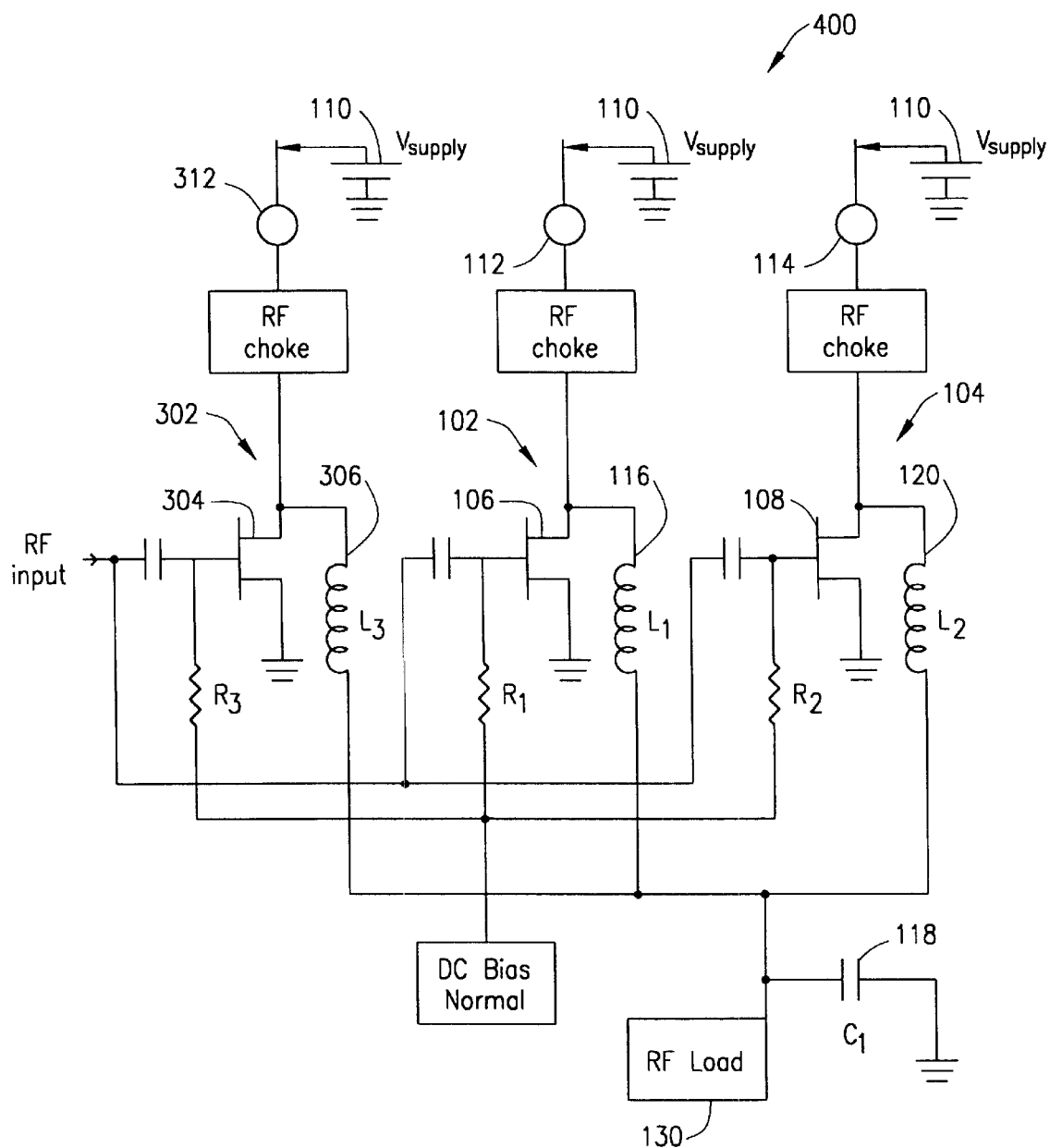
FIG. 4 depicts a power amplifier, according to the present invention, that has more than two circuits connected in parallel.

FIG. 4 depicts yet another embodiment of a power amplifier according to the present invention. FIG. 4 illustrates the power amplifier of the present invention being implemented with more than two parallel circuits like 102 and 104. While power amplifier 400 is shown as being implemented with three parallel circuits 302, 102, and 104, one of ordinary skill in the art will appreciate that power amplifier 400 could be constructed with N number of parallel circuits like circuits 302, 102, and 104, where N is a positive integer. Circuits 302, 102, and 104 could be turned on/off (that is, disconnected from voltage supply 110) in any combination, thereby providing a number of states with high resolution of the setting of the load impedance.

Referring back to FIG. 1, to operate power amplifier 100 at full output power both connectors 112 and 114 should be "turned on," thereby connecting transistors 102 and 104 to the power supply 110. Additionally both transistors 102 and 104 should be biased normally.

Figure 2:
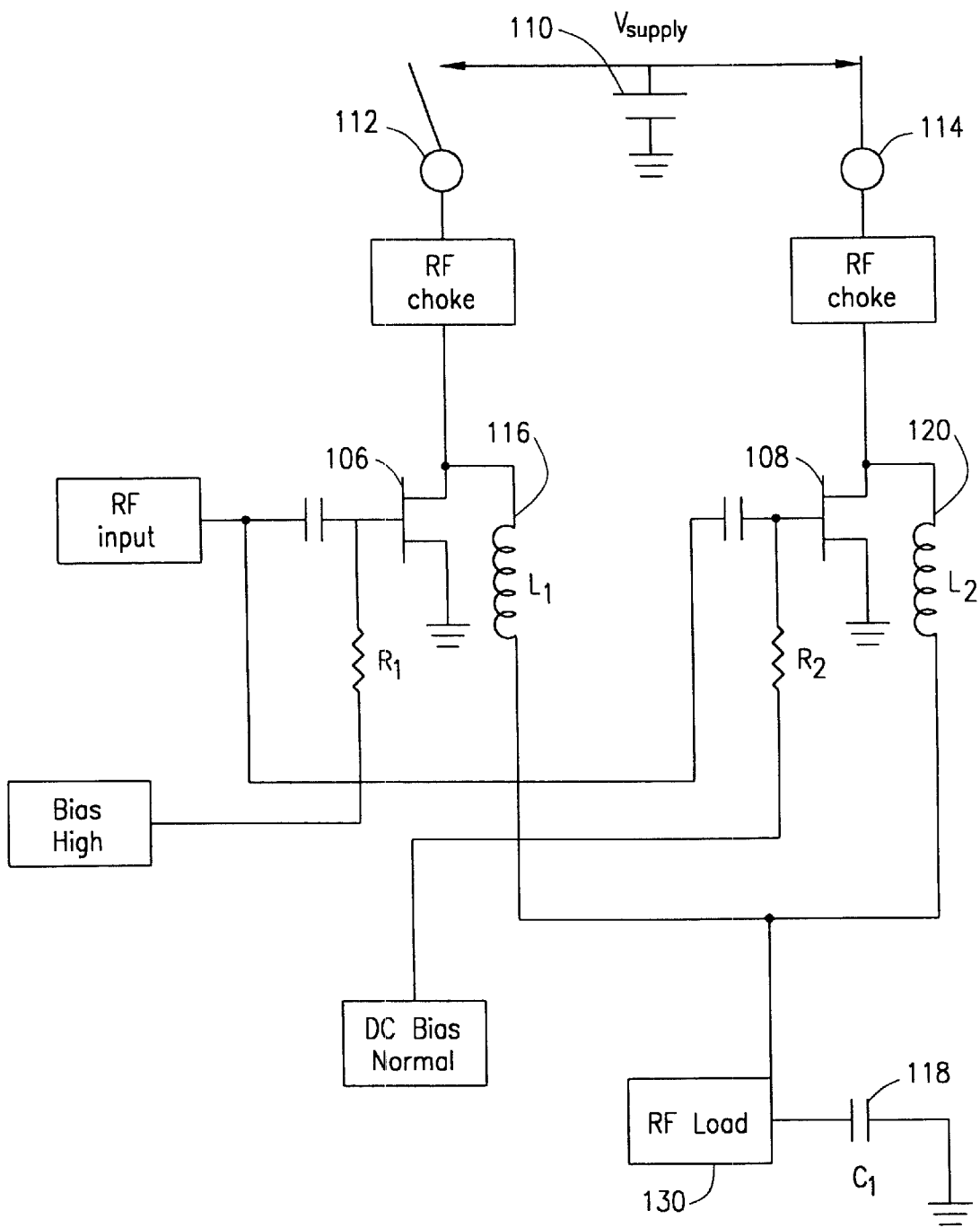
FIG. 2 depicts the power amplifier when it is operating in a low power mode.

FIG. 2 illustrates the configuration of power amplifier 100 when it is operated at less than full output power. In this case, connector 112 is turned off, thereby disconnecting transistor 106 from the power supply 110. Additionally, transistor 106 is biased to an "on-state," which makes transistor 106 a low impedance to ground. That is, instead of operating as an amplifier, transistor 106 is a connection to ground. Because connector 112 is open, no DC-current is consumed in transistor 106.

Since transistor 106 is shorted, inductor 116 is shorted to ground. This puts inductor 116 in parallel with capacitor 118. Because it is the admittance over capacitance 118 that that sets the real part of the impedance transformation from the load 130, an inductance in parallel with capacitor 118 lowers the admittance and, thereby, lowers the impedance transformation ratio. This leads to an increase in the load resistance presented to the output transistor 108. Thus, power amplifier will operate at a high efficiency even at a lower output power.

In one embodiment, the inductance of inductor 116 is chosen so that the effects of capacitor 118 are eliminated by introducing a parallel resonance between inductor 116 and capacitor 118.

Figure 5:
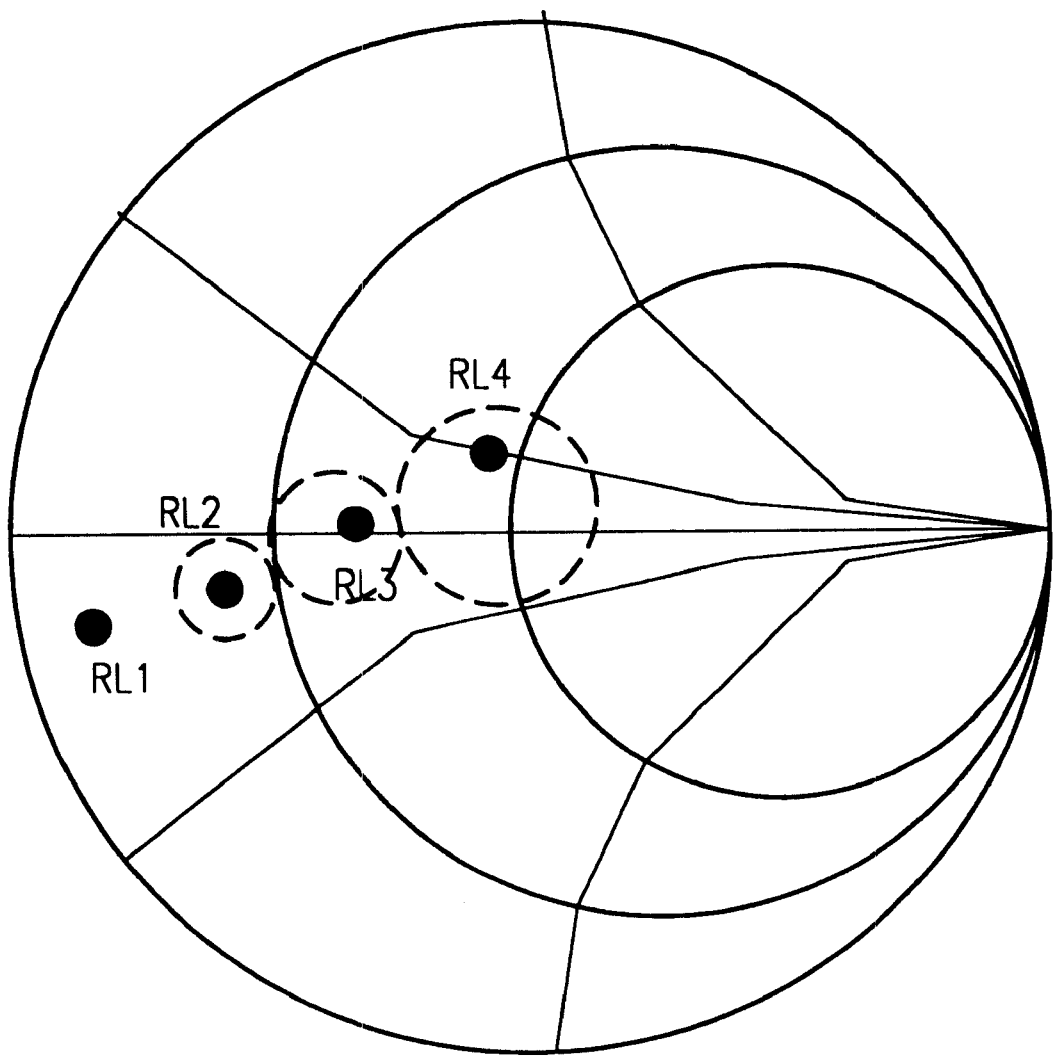
FIG. 5 depicts a smith chart that illustrates how the load changes at different output powers.

FIG. 5 is a rough estimate of a smith chart that illustrates how the load changes at different output powers. RL1 is the load for full output power and at RL4 the transformation ratio is zero. A slight phase error will be present caused by the series inductance that will still be in the circuit. Dotted rings around each of RL2, RL3 and RL4 indicate where good matching may be reached.

While various embodiments of the present invention have been described above, it should be understood that they have been presented by way of example, and not limitation. It will be understood by those skilled in the art that various changes in form and detail may be made therein without departing from the spirit and scope of the invention as defined by the following claims. Thus the breadth and scope of the present invention should not be limited by any of the above-described exemplary embodiments, but should be defined only in accordance with the following claims and their equivalents.

What is claimed is:

1. A power amplifier, comprising:
   a first circuit including a first transistor having an input terminal for receiving a radio frequency (RF) input, a first output terminal connected to ground, and a second output terminal connected to a first inductor connected in series with a capacitor and also connected to a voltage supply through a first controllable connector;
   a second circuit including a second transistor having an input terminal for receiving the radio frequency (RF) input, a first output terminal connected to ground, and a second output terminal connected to a second inductor connected in series with the capacitor and also connected to a voltage supply through a second controllable connector;
   bias means for biasing the first transistor and the second transistor, wherein the first circuit is connected in parallel to the second circuit;
   wherein the power amplifier is adapted to be operated in at least two output-power modes;
   wherein, in a first output-power mode of the at least two output-power modes, the first transistor and the second transistor are connected to the voltage supply and a bias voltage for the first transistor is at a normal level; and
   wherein, in a second output-power-mode of the at least two output-power modes, the first transistor is disconnected from the voltage supply and the bias voltage for the first transistor is at a level greater than the normal level, the first transistor thereby providing a low resistance to ground.

2. The power amplifier of claim 1, wherein the first and second controllable connector is a switch.

3. The power amplifier of claim 1, wherein the first and second controllable connector is a linear regulator.

4. The power amplifier of claim 1, wherein the first transistor and the second transistor are bipolar junction transistors.

5. The power amplifier of claim 4, wherein the first inductor is connected to the collector of the first transistor, the second inductor is connected to the collector of the second transistor, and the emitter of the first transistor and the emitter of the second transistor are both connected to ground.

6. The power amplifier of claim 1, wherein the first transistor and the second transistor are field effect transistors.

7. The power amplifier of claim 6, wherein the first inductor is connected to the drain of the first transistor, the second inductor is connected to the drain of the second transistor, and the source of the first transistor and the source of the second transistor are both connected to ground.

8. A power amplifier, comprising:
   a first circuit including a first transistor having an input terminal for receiving a radio frequency (RF) input, a first output terminal connected to ground, and a second output terminal connected to a first capacitor connected in series with an inductor and also connected to a voltage supply through a first controllable connector;
   a second circuit including a second transistor having an input terminal for receiving the radio frequency (RF) input, a first output terminal connected to ground, and a second output terminal connected to a second capacitor connected in series with the inductor and also connected to a voltage supply through a second controllable connector;
   bias means for biasing the first transistor and the second transistor, wherein the first circuit is connected in parallel to the second circuit
   wherein the power amplifier is adapted to be operated in at least two output-power modes;
   wherein, in a first output-power mode of the at least two output-power modes, the first transistor and the second transistor are connected to the voltage supply and a bias voltage for the first transistor is at a normal level; and
   wherein, in a second output-power mode of the at least two output-power modes, the first transistor is disconnected from the voltage supply and the bias voltage for the first transistor is at a level greater than the normal level, the first transistor thereby providing a low resistance to ground.

9. The power amplifier of claim 8, wherein the first and second controllable connector is a switch.

10. The power amplifier of claim 8, wherein the first and second controllable connector is a linear regulator.

11. The power amplifier of claim 8, wherein the first transistor and the second transistor are bipolar junction transistors.

12. The power amplifier of claim 11, wherein the first capacitor is connected to the collector of the first transistor, the second capacitor is connected to the collector of the second transistor, and the emitter of the first transistor and the emitter of the second transistor are both connected to ground.

13. The power amplifier of claim 8, wherein the first transistor and the second transistor are field effect transistors.

14. The power amplifier of claim 13, wherein the first capacitor is connected to the drain of the first transistor, the second capacitor is connected to the drain of the second transistor, and the source of the first transistor and the source of the second transistor are both connected to ground.

15. A power amplifier comprising:
a plurality of circuits connected in parallel, each of the plurality of circuits comprising:
(1) a transistor connected to a supply voltage through a controllable connector; and
(2) an inductor connected to the transistor and connected in series to a capacitor that is connected to ground;
wherein, in a first output-power mode, at least two of the plurality of transistors are connected to the supply voltage and a bias voltage for each of the at least two transistors is at a normal level; and
wherein, in a second output-power-mode:
at least one of and fewer than the at least two transistors are disconnected from the supply voltage; and
the bias voltage for each of the at least one of and fewer than the at least two transistors is at a level greater than the normal level, each of the at least one of and fewer than the at least two transistors thereby providing a low resistance to ground.

16. The power amplifier of claim 15, wherein the transistors are bipolar junction transistors.

17. The power amplifier of claim 15, wherein the transistors are field effect transistors.

18. A mobile communication device comprising a power amplifier according to claim 15.

19. A power amplifier comprising:
a plurality of circuits connected in parallel, each of the plurality of circuits comprising:
(1) a transistor connected to a supply voltage through a controllable connector, and
(2) a capacitor connected to the transistor and connected in series to an inductor that is connected to ground;
wherein, in a first output-power mode, at least two of the plurality of transistors are connected to the supply voltage and a bias voltage for each of the at least two transistors is at a normal level; and
wherein, in a second output-power-mode:
at least one of and fewer than the at least two transistors are disconnected from the supply voltage; and
the bias voltage for each of the at least one of and fewer than the at least two transistors is at a level greater than the normal level, each of the at least one of and fewer than the at least two transistors thereby providing a low resistance to ground.

20. The power amplifier of claim 19, wherein the transistors are bipolar junction transistors.

21. The power amplifier of claim 19, wherein the transistors are field effect transistors.

22. A method of operating a power amplifier comprising a first circuit connected in parallel with a second circuit, wherein the first circuit includes a first transistor connected to a supply voltage and a first inductor connected to the first transistor and connected in series to a capacitor that is connected to ground and the second circuit includes a second transistor connected to the supply voltage and a second inductor connected to the second transistor and connected in series to the capacitor, and DC-bias means for biasing the first transistor and the second transistor, the method comprising the steps of:
disconnecting the first transistor from the supply voltage; and
increasing the bias voltage for the first transistor, thereby turning on the first transistor so that it has a low resistance to ground.

23. A method of operating a power amplifier comprising a first circuit connected in parallel with a second circuit, wherein the first circuit includes a first transistor connected to a supply voltage and a first capacitor connected to the first transistor and connected in series to an inductor that is connected to ground and the second circuit includes a second transistor connected to the supply voltage and a second capacitor connected to the second transistor and connected in series to the inductor, and DC-bias means for biasing the first transistor and the second transistor, the method comprising the steps of:
disconnecting the first transistor from the supply voltage; and
increasing the bias voltage for the first transistor, thereby turning on the first transistor so that it has a low resistance to ground.

24. The method of claim 22, wherein the steps are performed in the order listed.

25. The method of claim 23, wherein the steps are performed in the order listed.

* * * * *